(12) United States Patent
Kim et al.

(10) Patent No.: US 8,284,121 B2
(45) Date of Patent: Oct. 9, 2012

(54) FLEXIBLE DISPLAY AND METHOD FOR FORMING ALIGNMENT KEY OF THE SAME

(75) Inventors: Ock Hee Kim, Anyang-si (KR); Ae Kyung Jeon, Seoul (KR); In Su Joo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1055 days.

(21) Appl. No.: 11/819,470

(22) Filed: Jun. 27, 2007

(65) Prior Publication Data

US 2008/0042929 A1 Feb. 21, 2008

(30) Foreign Application Priority Data

Jun. 30, 2006 (KR) .................. 10-2006-0060612

(51) Int. Cl.
*G09G 3/34* (2006.01)
*G09G 3/20* (2006.01)
*H01L 23/544* (2006.01)
*H01L 27/14* (2006.01)

(52) U.S. Cl. ............... 345/55; 345/82; 345/76; 345/87; 345/206; 257/797; 257/72

(58) Field of Classification Search .............. 345/55, 345/173–178, 87, 206, 84, 82, 76; 257/797, 257/72; 349/158
See application file for complete search history.

(56) References Cited

U.S. PATENT DOCUMENTS

| | | | | |
|---|---|---|---|---|
| 5,771,085 A * | 6/1998 | Ochi et al. | ............ | 349/158 |
| 5,812,284 A * | 9/1998 | Mizutani et al. | ............ | 358/482 |
| 5,850,276 A * | 12/1998 | Ochi et al. | ............ | 349/158 |
| 6,335,540 B1 * | 1/2002 | Zhang | ............ | 257/53 |
| 6,400,431 B1 * | 6/2002 | Morio et al. | ............ | 349/95 |
| 2006/0049408 A1 * | 3/2006 | Sohn et al. | ............ | 257/72 |
| 2006/0091394 A1 * | 5/2006 | Honda | ............ | 257/66 |
| 2006/0187385 A1 * | 8/2006 | Liao et al. | ............ | 349/114 |
| 2007/0145002 A1 * | 6/2007 | Street | ............ | 216/2 |
| 2007/0262936 A1 * | 11/2007 | Chang et al. | ............ | 345/87 |

FOREIGN PATENT DOCUMENTS

| | | |
|---|---|---|
| CN | 1492285 | 4/2004 |
| WO | WO 03/088724 | 10/2003 |
| WO | WO 2005/045513 | * 5/2005 |

* cited by examiner

*Primary Examiner* — Lun-Yi Lao
*Assistant Examiner* — Jarurat Suteerawongsa
(74) *Attorney, Agent, or Firm* — McKenna Long & Aldridge LLP

(57) ABSTRACT

A flexible display and method for forming alignment key of the same are disclosed, which includes an alignment key required to align positions between film layers, the flexible display comprising a substrate defined display area and non-display area and an alignment key forming part including an alignment key and transmission part at the circumference of the alignment key, wherein the alignment key forming part is formed at the non-display area of the substrate.

9 Claims, 6 Drawing Sheets

FLEXIBLE DISPLAY AND METHOD FOR FORMING ALIGNMENT KEY OF THE SAME

This application claims the benefit of the Korean Patent Application No. P2006-60612, filed on Jun. 30, 2006, which is hereby incorporated by reference as if fully set forth herein.

BACKGROUND OF THE INVENTION

1. Field of the Invention

The present invention relates to a display device, and more particularly, to a flexible display and the method for forming an align key of the same, the flexible display which includes an alignment key required to align positions between film layers.

2. Discussion of the Related Art

With the recent trend to the information society, displays have the attentions as information transmitters. To use the displays in various fields, it is necessary for the displays to realize the low power consumption, the thin profile, the lightness in weight, and the high resolution.

The displays may be classified into a luminous type and a non-luminous type, wherein the luminous type displays correspond to an electro-luminescence (EL) display, a vacuum fluorescent display (VFD), and a plasma display panel (PDP); and the non-luminous type display corresponds to a liquid crystal display (LCD).

In recent days, a flexible display is beginning to make its appearance, which can be kept folded or rolled without any damages.

Even if various problems occurs in the recent flexible displays, the flexible display technologies are applied to the various displays using a thin film transistor (TFT) LCD device, an organic light-emitting diode (OLED), and a electrophoretic display.

In addition to the above-mentioned flexible display using the complex structure, the simple structure flexible display is also studied and researched.

Hereinafter, a related art flexible display will be explained with reference to the accompanying drawings.

FIGS. 1A and 1B are illustrating photographs of a related art flexible display.

As shown in FIGS. 1A and 1B, the flexible display is generally referred to as a scroll display. The flexible display is formed with a thin plastic substrate, which can be kept folded or rolled without damages. In this respect, the flexible display is one of next-generation displays. Up to date, the flexible display is applied to the OLED or the LCD in that the OLED or the LCD can be fabricated by the thin profile below 1 mm.

The OLED can emit the light in itself, and can obtain the good visibility in the dark surroundings as well as the bright surroundings. Among the nowadays-used displays, the OLED has the most rapid response speed which is one of most important standards to judge the function of mobile display.

Also, the OLED can be used to mobile devices, for example, mobile phones which can be designed with the ultra-thin profile. To realize the flexible display using the OLED, it necessarily uses the flexible substrate of plastic.

However, the related art flexible display has the following disadvantages.

Contrary to a common organic light emitting device, which is easy to form a thin film transistor (TFT) array or an organic emitting layer etc. with an alignment key formed on a transparent glass substrate, the flexible display is difficult to form forming layers since an alignment key is formed on the opaque plastic substrate and the alignment key is not visible in the process of align, therefore an alignment of positions between forming layers is not well done.

FIG. 2 is a cross section view for aligning the common glass substrate, FIG. 3 is an enlarged view long 'A' region of FIG. 2 and FIG. 4 is an illustrated figure in the process of observing 'A' region of FIG. 3 using a vision camera.

In the case of a common organic light emitting device when forming an organic emitting layer, as shown in FIG. 2 to FIG. 4, an alignment key 21 is formed at an edge of the substrate on the transparent glass substrate 20, and a vision camera is disposed corresponding to the edge of the substrate, and a shadow mask is disposed under the glass substrate and a source of an organic emitting material under the shadow mask 30.

In this case, corresponding to the alignment key of glass substrate, a mask alignment hole 35 is formed on the shadow mask 30, the vision camera 10 observes the detected region corresponding to the alignment key 21 and detects the degree of an alignment between the glass substrate 20 and shadow mask 30. In the shadow mask 30, a light shielding part 40 is defined at an outer portion of the alignment hole 35.

The related art flexible display has the following disadvantages.

However, the flexible display including the metal substrate, as shown in FIG. 2, since the metal substrate is made of an opaque material, in the case that the vision camera is disposed above the flexible display and the shadow mask is disposed under the flexible display, it is impossible to detect the alignment key using the vision camera.

SUMMARY OF THE INVENTION

Accordingly, the present invention is directed to a flexible display, which substantially obviates one or more problems due to limitations and disadvantages of the related art.

An advantage of the present invention is to provide a flexible display which includes an alignment key required to align positions between film layers. Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flexible display comprises a substrate defined display area and non-display area and an alignment key forming part including an alignment key and transmission part at the circumference of the alignment key, wherein the alignment key forming part is formed at the non-display area of the substrate.

At this time, the substrate may be made of metal and the substrate in the transmission part is oxidized to be metal oxide. Otherwise, the transmission part may be formed as a thickness less than the alignment key by electro-polishing. Or epoxy material may be formed on the transmission part.

Also, the alignment key can be formed of a shape of circle or polygon.

Also, the substrate excluding the transmission part is formed of opaque metal. At this time, e.g. the substrate may be made of at least one of Al, SUS series (Stainless Use Steel) and, alloy including Al and SUS series.

Also, the substrate has the thickness about 10 μm to 9 mm (9000 μm).

In another aspect of the present invention, there is provided a method for forming an alignment key flexible display device comprising coating a photo resist layer on a substrate defined display area and non-display area, wherein the non-display area has an alignment key forming part, forming photo resist pattern by selectively removing the photo resist layer to expose and develop a portion corresponding to the alignment key forming part except a center part of the alignment key forming part and forming an alignment key in the center part inside the alignment key forming part and a transmission part to be transparent at the circumference of the alignment key.

In this case, the step of baking the photo resist pattern after the step of forming the photo resist pattern can be further comprised.

The step of forming the alignment key and transmission part can include dipping the substrate at one side and an electrode at the other side, respectively, in a bath filled with oxidation solution and inducing oxidation-reduction reaction between the alignment key forming part of the substrate and the electrode and oxidizing the transmission part by using the photo resist pattern as a mask. At this time, the oxidation solution may be made of at least of oxalic acid, phosphoric acid, sulfuric acid and mixed solution including the formers. And the step of removing the photo resist pattern by using stripper can be further comprised.

Otherwise, the step of forming the alignment key and transmission part includes electro-polishing the alignment key forming part of the substrate by using the photo resist pattern as a mask.

Or the step of forming the alignment key and transmission part include coating an epoxy material on the alignment key forming part by using the photo resist pattern as a mask.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, a flexible display according to the present invention will be described with reference to the accompanying drawings.

Figure 1A:
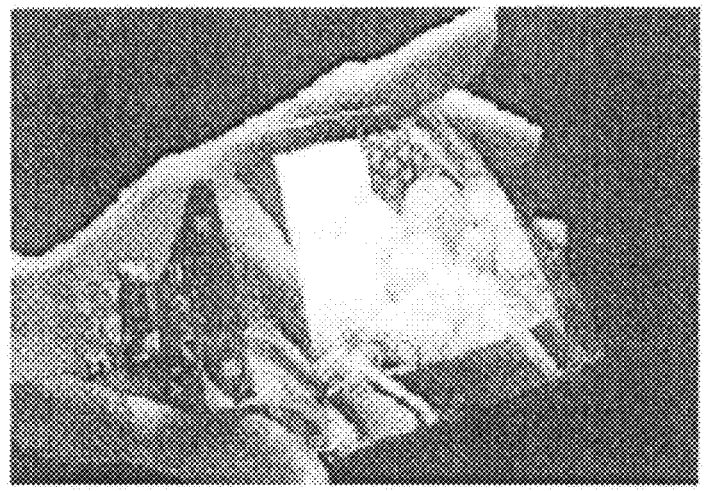
FIGS. 1A and 1B are illustrating photographs of a related art flexible display.
Figure 1B:
Figure 2:
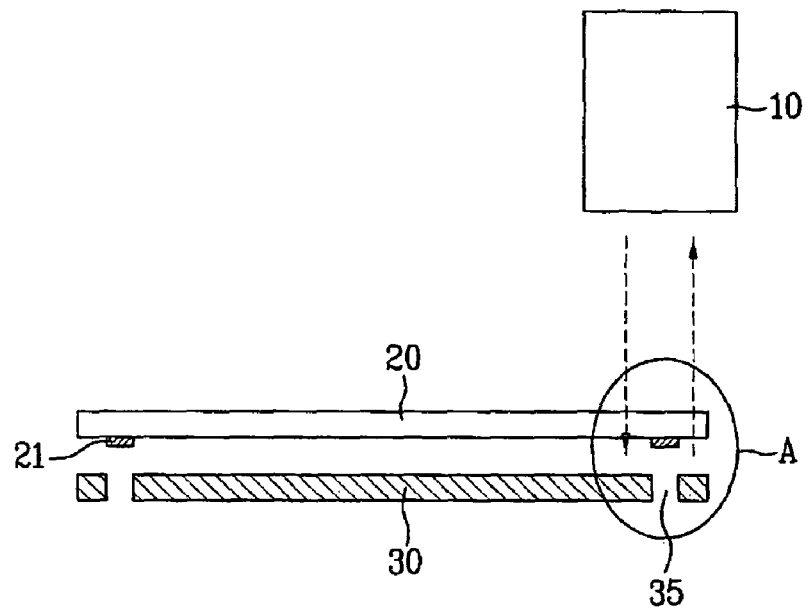
FIG. 2 is a cross section view for aligning the glass substrate in related art.
Figure 3:
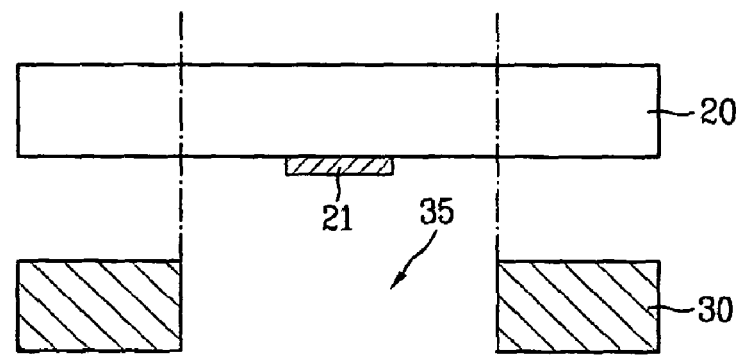
FIG. 3 is an enlarged view long 'A' region of FIG. 2.
Figure 4:
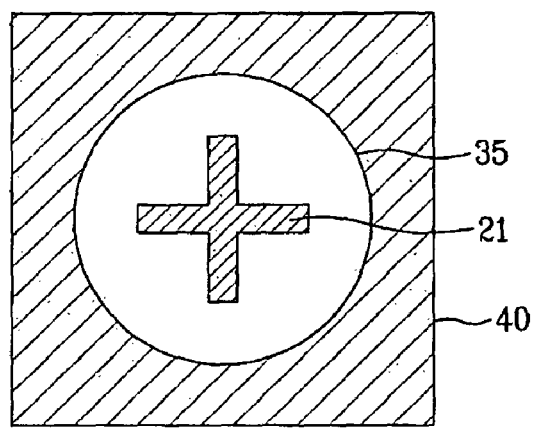
FIG. 4 is an illustrated figure in the process of observing 'A' region of FIG. 3 using a vision camera.
Figure 5:
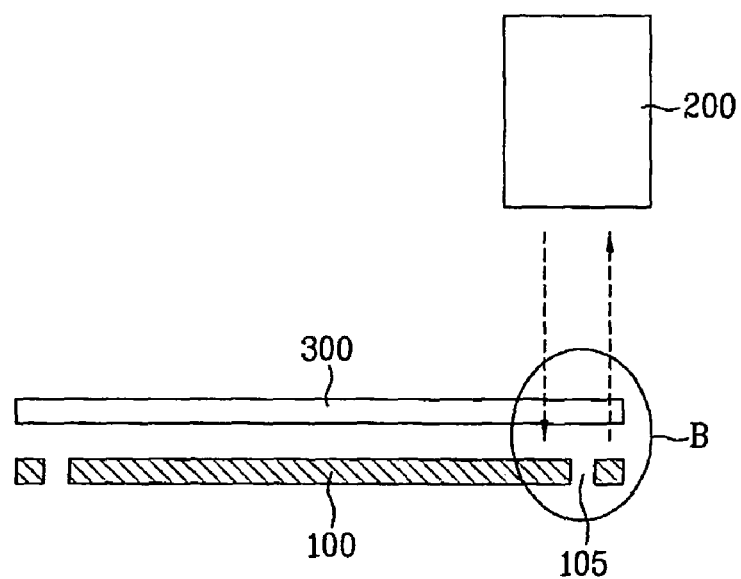
FIG. 5 is a cross section view of a flexible display and a method for aligning positions of the same according to an embodiment.
Figure 6:
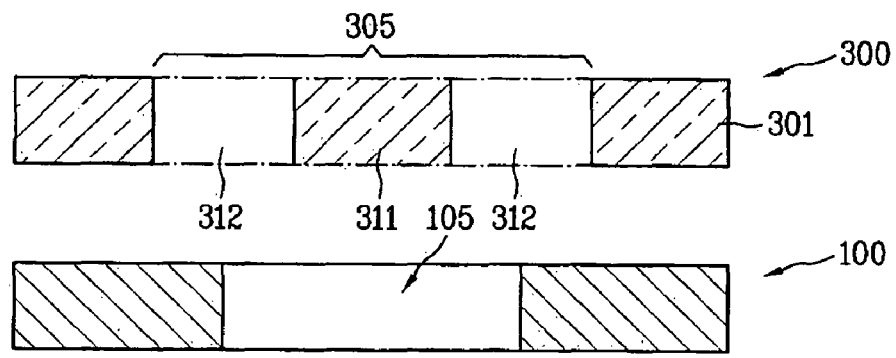
FIG. 6 is an enlarged view long 'B' region of FIG. 5.
Figure 7:
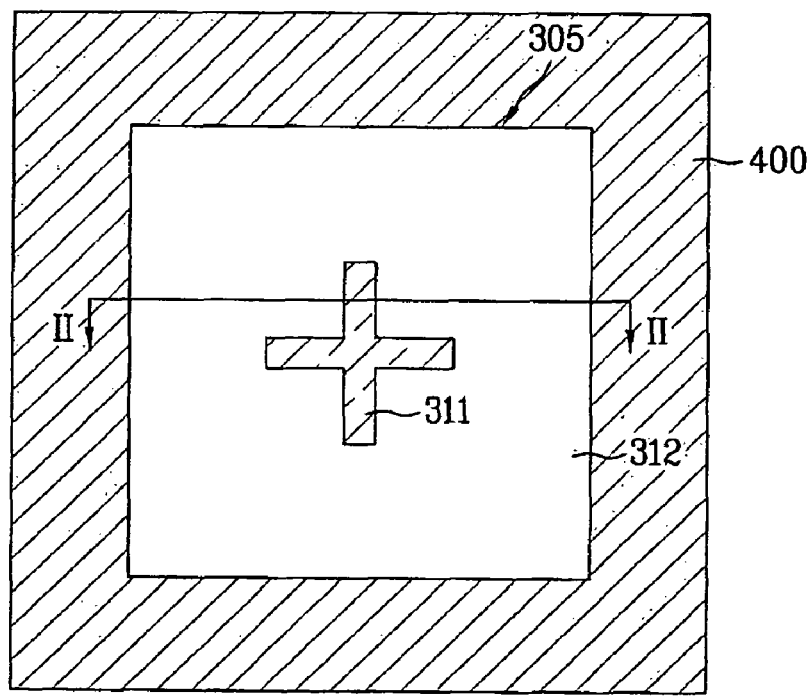
FIG. 7 is an illustrated figure in the process of observing 'B' region of FIG. 5 using a vision camera.

FIG. 5 is a cross section view of a flexible display and a method for aligning positions of the same according to an embodiment, FIG. 6 is an enlarged view long 'B' region of FIG. 5, and FIG. 7 is an illustrated figure in the process of observing 'B' region of FIG. 6 using a vision camera.

As shown in FIGS. 5 to 7, the flexible display according to the embodiment, includes, the substrate 300 and an alignment key forming part formed 305 on the edge of the substrate 300, wherein the alignment key forming part 305 has an alignment key 311 and a transmission part 312. The transmission part 312 is formed to oxidize the region excluding the region corresponding to the alignment key 311 in the alignment key forming part 305.

A shadow mask 100 is disposed under the flexible display substrate 300, a mask hole 105 of the shadow mask 100 is formed in the region corresponding to the alignment key 311 and a vision camera 200 is disposed above the flexible display substrate 300.

Once the observation part of vision camera 400 is detected and the alignment key 311 of the flexible display substrate 300 is read using the vision camera 200, the mask hole 105 corresponding to the shadow mask 100 is found so as to align the shadow mask 100 and the flexible display substrate 300.

Next, source of an organic emitting material is disposed under the shadow mask 100 and then an organic emitting layer is formed to transmit (permeate) the pattern of the shadow mask 100 on the flexible display substrate 300.

Here, a normal metal 301 is formed on the region excluding the alignment key forming part 305 without additional oxidation treatment. The alignment key forming part 305 is formed on the predetermined part of non-display region on the flexible display substrate, wherein the non-display region is not displayed region.

FIGS. 8A~8D are plan views and cross section views illustrating a method for forming an alignment key of the flexible display according to the embodiment.

First, a photo resist layer 351 is formed on the flexible display substrate 350. As show FIG. 8A, the photo resist layer 351 is formed in the shape of covering the upper side, the lower side and the lateral side together. The reason why the photo resist layer 351 has this shape is to protect the substrate and to prevent damage excluding the transmission part (312 in FIG. 8D) while the flexible display substrate 350 is dipped (soaked) in an oxidization solution, to oxidize the transmission part corresponding to the circumference of the alignment key (311 in FIG. 8D).

Here, the flexible display substrate 350, in example, is made of Al or SUS (Stainless Use Steel) series or reflective metal. And, the thickness of the flexible display substrate 350 is about 10 μm~9 mm (9000 μm).

The photo resist is made of at least one of acryl series, e.g. Novolak series etc., the photo resist may be positive or negative photo-sensitivity. In this case, an image of the mask required to pattern the photo resist layer is determined based on the photo-sensitivity of the photo resist.

Figure 8A:
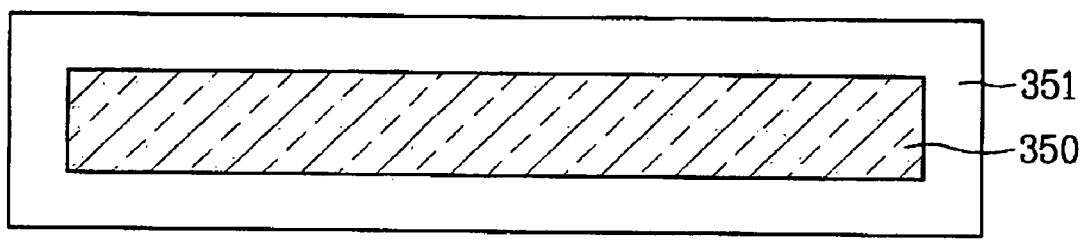
FIG. 8A~8D are cross section views illustrating a method for forming an alignment key of the flexible display according to the embodiment.
Figure 8B:
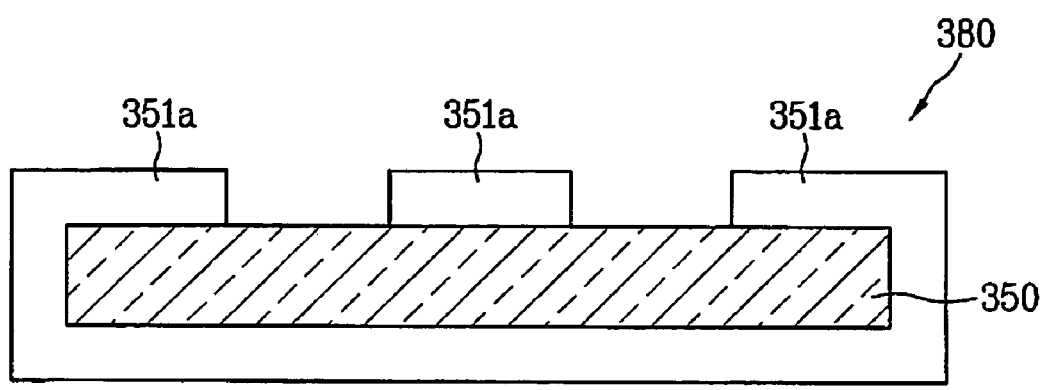

As shown in FIG. 8b, the photo resist 351 is selectively exposed and developed, so that a photo resist pattern 351a is formed to open a predetermined part. The non-display area of the flexible display substrate 350 has an alignment key forming part at the edge of the flexible display substrate 350. The photo resist pattern 351a is formed by selectively removing the photo resist layer 351 to expose and develop the portion corresponding to the alignment key forming part (305 in FIG. 8D) except a center part of the alignment key forming part.

Next, the photo resist pattern 351a is baked to be stable without its deforming in the next process.

Figure 8C:
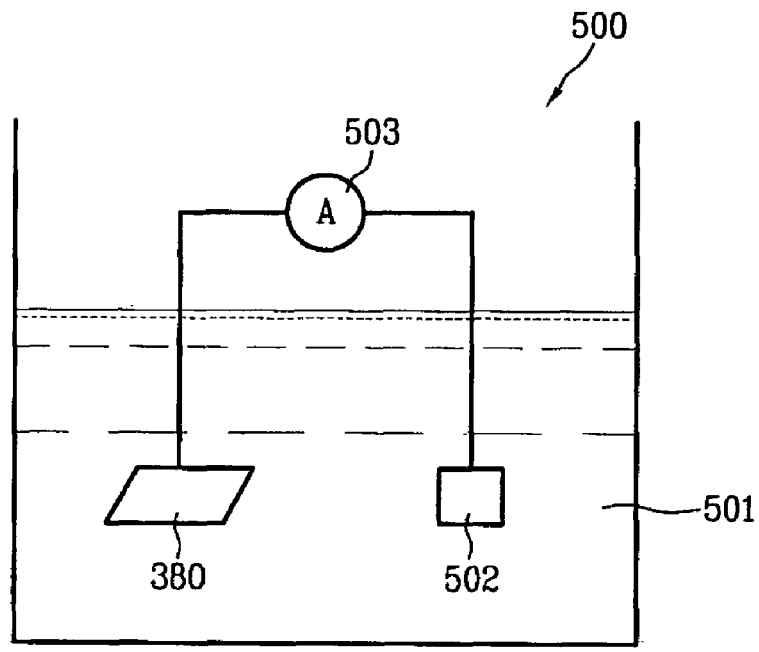

As shown in FIG. 8C, the flexible display substrate 380 including the photo resist pattern 351a is dipped in the bath 500 filled with an oxidation solution and an electrode 502 is dipped in other part of the oxidation solution, and then a current is flowed through a galvanometer between the flexible display substrate 380 and the electrode 502, induced oxidation-reduction reaction between the opened alignment key forming part 305 of flexible display substrate 380 and the electrode.

Figure 8D:
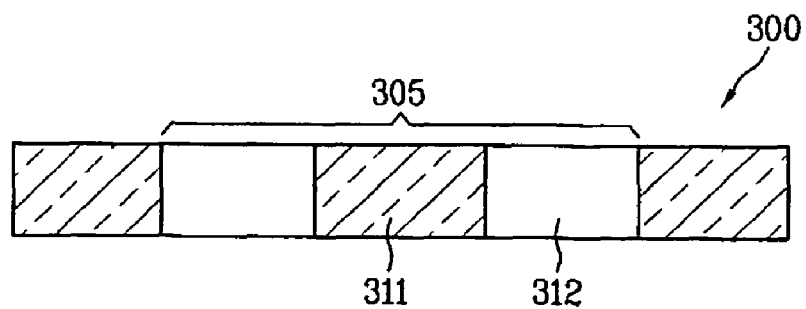

Through this oxidation-reduction reaction the exposed part of the flexible display substrate 350 is oxidized, in example, in this case, the flexible display substrate 350 is made of Al material, the oxidized part is denaturalized to Al2O3. As shown in FIG. 8D, the oxidized part is shown to be transparent, therefore it is used as a transmission part 312. In the alignment key forming part, the masked part with the photo resist pattern 351a is remained as it is, the masked part of the alignment key forming part is used as an alignment key 311 after the process of observation using a vision camera.

The transmission part 312 is oxidized corresponding to the thickness of the flexible display substrate 300. Unless the transmission part 312 is oxidized less than the thickness of the flexible display substrate 300, oxidation should be accomplished for the alignment key forming part up to the state to be shown through the vision camera.

The method as stated above is an electrochemical method, in this case the oxidation solution 501 is made of oxalic acid, phosphoric acid, sulfuric acid or mixed solution including the former.

And as shown in FIG. 8D, the removing of photo resist pattern 351a is processed with dipping in a stripper solution to strip the photo resist material selectively.

Beside the electrochemical method, there is an electro-polishing method as method of forming an alignment key in the shape of the transmission part. The electro-polishing method is a method to decrease thickness of a predetermined. In this case, after the electro-polishing, the observation of the degree of alignment is performed with observing the step difference between decreased part and non-decreased part using a vision camera. And it is possible to align between shadow mask and flexible display substrate with the observation.

The electro-polishing method is alternate with the electrochemical method or carried out with electrochemical method together.

Also, beside the electrochemical method or electro-polishing, it is possible to form an epoxy series material on the region corresponding to the transmission part, to be shown transparent.

Also, the shape of the alignment key 311 in FIG. 7 may be changeable as a circle or polygon including a triangle or rectangular or star shape.

The flexible display substrate including alignment key according to the present invention, is formed through a treatment on the flexible display substrate and the flexible display substrate including alignment key can align between evaporated or deposited forming layer and shadow mask including pattern to deposit or evaporate.

As mentioned above, the flexible display according to the present invention has the following advantages.

First, the flexible display substrate is made of opaque metal, in the related art, the vision camera above the rear surface cannot observe position of alignment, so that an extra apparatus to align is needed. In the present invention, the flexible display substrate has an alignment key in itself defined of oxidation, so that the alignment key can align between evaporated or deposited forming layer on the flexible display substrate and shadow mask including pattern to deposit or evaporate without extra outer alignment apparatus.

Secondly, due to that there is an alignment key in the flexible display substrate, so that in the process of forming organic emitting layer or other forming layer, it is possible to simplify apparatus required while the alignment process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for forming an alignment key flexible display comprising:
    coating a photo resist layer on a substrate defined display area and non-display area, wherein the non-display area has an alignment key forming part, wherein the substrate is flexible and made of opaque metal;
    forming a photo resist pattern by selectively removing the photo resist layer to expose and develop a portion corresponding to the alignment key forming part except a center part of the alignment key forming part; and
    forming an alignment key in the center part inside the alignment key forming part and a transmission part at the circumference of the alignment key by oxidizing the substrate at the circumference of the aligment key within the aligment key forming part, wherein the transmission part is transparent after oxidizing.

2. The method of claim 1, further comprising a step of baking the photo resist pattern after the step of forming the photo resist pattern.

3. The method for claim 1, wherein the step of forming the alignment key and transmission part includes:
    dipping the substrate at one side and an electrode at the other side, respectively, in a bath filled with an oxidation solution; and
    inducing an oxidation-reduction reaction between the alignment key forming part of the substrate and the electrode and oxidizing the substrate corresponding to the transmission part by using the photo resist pattern as a mask.

4. The method of claim 3, wherein the oxidation solution is made of at least one of oxalic acid, phosphoric acid, sulfuric acid and a mixed solution including formers.

5. The method of claim 4, further comprising a step of removing the photo resist pattern by using a stripper.

6. The method of claim 1, wherein the step of forming the alignment key and transmission part includes:
    electro-polishing the alignment key forming part of the substrate by using the photo resist pattern as a mask.

7. The method of claim 1, wherein the step of forming the alignment key and transmission part includes:
    coating an epoxy material on the alignment key forming part by using the photo resist pattern as a mask.

8. The method of claim 1, wherein the substrate is made of at least one of Al, SUS series and an alloy including Al or SUS series.

9. The method of claim 1, wherein the substrate has a thickness of about 10 μm to about 9 mm (9000 μm).

* * * * *